United States Patent [19]
Yamamoto et al.

[11] Patent Number: 5,738,739
[45] Date of Patent: Apr. 14, 1998

[54] METHOD FOR PRODUCING LOW CARBON EQUIVALENT ROLLED STEEL SHAPES BY CONTROLLED ROLLING

[75] Inventors: Kohichi Yamamoto; Yasushi Takeshima; Akira Inagaki, all of Sakai; Naoki Oda, Ohita, all of Japan

[73] Assignee: Nippon Steel Corporation, Tokyo, Japan

[21] Appl. No.: 791,833

[22] Filed: Jan. 30, 1997

Related U.S. Application Data

[63] Continuation of Ser. No. 466,963, Jun. 6, 1995, abandoned, which is a continuation of Ser. No. 145,169, Nov. 3, 1993, abandoned.

[30] Foreign Application Priority Data

Feb. 4, 1993 [JP] Japan ................... 5-017491

[51] Int. Cl.$^6$ ................... C22C 38/00
[52] U.S. Cl. ................... 148/641; 148/643
[58] Field of Search ................... 148/641, 643

[56] References Cited

FOREIGN PATENT DOCUMENTS

| 62-253721 | 11/1987 | Japan | 148/643 |
| 64-62415 | 3/1989 | Japan | 148/643 |
| 3-274225 | 12/1991 | Japan | . |

OTHER PUBLICATIONS

Frantz et al., "Advanced Thermomechanical Rolling Technologies for Heavy Beams", Metallurgical Plant and Technology Mar. 1989, pp. 94, 96, 100, 102, 106, page with Figure 12.
Patent Abstracts of Japan, vol. 18, No. 191 (C–1186), Apr. 4, 1994, & JP-A-05 345915 (Nippon Steel Corp.), Dec. 27, 1993, *abstract*.
Patent Abstracts of Japan, vol. 18, No. 151 (M–1576), Mar. 14, 1994, & JP-A-05 329521 (Kawasaki Steel Corp.), Dec. 14, 1993, *abstract*.
Patent Abstracts of Japan, vol. 16, No. 419 (C–981), Sep. 3, 1992, & JP-A-04 143224 (Kawasaki Steel Corp.), May 18, 1992, *abstract*.
Patent Abstracts of Japan, vol. 15, No. 208 (M–1117), May 28, 1991, & JP-A-03 057509 (Nippon Steel Corp.), Mar. 12, 1991, *abstract*.
Patent Abstracts of Japan, vol. 16, No. 342 (C–966), Jul. 24, 1992, & JP-A-04 103720 (Kawasaki Steel Corp.), Apr. 6, 1992, *abstract*.
Patent Abstracts of Japan, vol. 6, No. 224 (M–170), Nov. 9, 1982, & JP-A-57 127501 (Nippon Kokan K.K.), Aug. 7, 1982, *abstract*.

*Primary Examiner*—Sikyin Ip
*Attorney, Agent, or Firm*—Wenderoth, Lind & Ponack

[57] ABSTRACT

A method for producing a steel section by a rolling process including a rough rolling step, an intermediate rolling step and a finishing rolling step. The intermediate rolling step comprises water-cooling the flange portion of the rough-rolled steel section between rolling passes in the intermediate rolling step to cool the surface layer of the flange to a temperature not higher than 750° C., and rolling the flange portion during recuperation of the surface layer of the flange at least one time between the rolling passes with a total draft not less than 20% and at an average rolling temperature not higher than 950° C. and, after the finishing rolling step the outer surface of the flange is cooled at a cooling rate ranging from 0.5° to 10° C./sec depending on the thickness of the flange. Also the carbon equivalent of the steel is controlled. The advantage is that steel sections of various contours and dimensions can be produced from minimized varieties of steel compositions.

3 Claims, 1 Drawing Sheet

METHOD FOR PRODUCING LOW CARBON EQUIVALENT ROLLED STEEL SHAPES BY CONTROLLED ROLLING

This application is a continuation of now abandoned application Ser. No. 08/466,963 filed Jun. 6, 1995, which is a continuation of now abandoned application Ser. No. 08/145,169 filed Nov. 3, 1993.

BACKGROUND OF THE INVENTION

1. Field of the Invention

The present invention relates to a method for producing structural shapes or sections of single steel grade, but of various dimensions, such as H-beams, I-beams, channels or unequal-sided unequal-thickness angles, for use as structural materials for buildings, and other shapes such as panels, by controlled rolling and accelerated cooling in such a manner as to produce the shapes of various dimensions from a minimized number of steel grades.

2. Description of the Related Art

Shapes or sections, such as H-beams which are used "as hot rolled" show a lowered strength in service as the flange thickness increases due to a lowered cooling rate after the rolling if the chemical compositions are the same. The decrease in strength has conventionally been compensated for by increasing their alloy ratio so as to assure a prescribed strength value.

Rolled H-beams have cross-sectional dimensions that greatly vary between various portions of the beams. Since the web portion is thinner than the flange portion, this results in web vs. flange differences with respect to the rolling draft (rolling reduction) amount during rolling as well as the heat history during and after rolling. Thus, the material quality differs even within a single shape between various portions thereof. The differences in material quality are more pronounced as the height of the web portion is increased, which causes corresponding increases in the thickness of the web and flange portions. In order to reduce such quality differences, it has been necessary for a conventional rolling production method to use blooms having chemical compositions already adjusted in accordance with various target sizes of the product so as to obtain H-beams of a uniform strength level. Thus, in order to produce H-beams of various dimensions, but of a uniform strength level, it has been necessary to set a variety of chemical compositions corresponding to the individual target dimensions, and to prepare blooms having such chemical compositions.

Japanese Laid-Open Patent Application No. 2-76236 discloses a method directed to reducing the surface hardness as well as to preventing ripples in cooled webs. In this method, the flange portion is water-cooled during intermediate rolling, and the work piece is cooled after finish-rolling. However, the disclosure does not specify the temperature and the draft amount employed in the intermediate rolling of the flange portion, nor does it specify the cooling rate employed after the finish rolling. Therefore, the above method cannot be utilized to minimize the number of varieties of the steel compositions required for the production of sections of various dimensions. The present invention has been intended, in contrast, to minimize the number of varieties of the steel compositions by reducing their carbon equivalent.

In the above-described circumstances, for the production of H-beams or the like, blooms having various steel compositions set in accordance with target product dimensions are prepared even when the blooms belong to a steel grade of the same strength level. This has certain disadvantages, because it is necessary, before rolling, to select a bloom of a steel composition appropriate for a desired product size from among blooms of various steel compositions, and various blooms must be stocked under precise inventory management, and because the production of blooms is performed in response to customer's orders which are often in relatively small quantities for a relatively great variety of products, and the entire amount of blooms obtained from a converter steel is rarely used in one rolling operation, and the remainder has to be stocked. Increases in bloom stock require additional complicated inventory management, thereby impairing productivity and increasing production cost.

SUMMARY OF THE INVENTION

The present invention relates to a method for producing low carbon-equivalent control-rolled shapes which enables production of shapes having the same strength level but having various dimensions by controlled rolling and accelerated cooling in such a manner that the shapes are produced from a minimized number of varieties of steel compositions and yet are produced in various dimensions with a reduced frequency of replacement of the rolls so as to simplify rolling, operations and inventory management, and that the produced shapes have a lowered carbon-equivalent so as to improve their material quality such as toughness and weldability.

According to the present invention, there is provided a method for producing low-carbon equivalent control-rolled shapes in which blooms having steel compositions prescribed in Japanese Industrial Standards G 3106 are rolled into shapes having flanges of a thickness of 12 to 40 mm, the method comprising the steps of: subjecting the bloom to rolling, the rolling being started after the bloom has been heated to a temperature within the range from 1100° to 1300° C., the rolling comprising an intermediate rolling step including sub-steps of water-cooling a flange portion of the work piece to a surface-layer temperature of the flange portion of not more than 750° C. between two succeeding rolling passes in the intermediate rolling step, and rolling the work piece during recuperation between two rolling passes at least one time in the intermediate rolling step, the rolling being performed in such a manner that the flange portion is rolled at an average rolling temperature of not more than 950° C. and with a total draft ratio of not less than 20% is achieved, and subjecting the work piece to a finishing rolling step after the intermediate rolling step; and cooling the outer surface of the flange portion at a cooling rate within the range from 0.5° to 10° C./S varying depending on a desired flange thickness, and the carbon equivalent as defined in Japanese Industrial Standards G 3106, is reduced to a range from 0.21 to 0.25% for SM400 steel and a range from 0.29 to 0.37% for SM490 steel so that sections of various contours and dimensions may be produced from blooms having a minimized number of varieties of steel compositions by controlled rolling with accelerated cooling.

DETAILED DESCRIPTION OF THE PREFERRED EMBODIMENTS

Figure 1:
FIG. 1 is a view schematically showing an apparatus which may be used to carry out a method according to the present invention.

As is generally known, Japanese Industrial Standards (JIS) G 3106 (revised in 1988), to which the present invention pertains, prescribes standards for "rolled steel materials for welded structures" applied to various structures such as buildings, bridges, ships and vehicles. According to the standards, such steel materials are classified into eleven classes in accordance with various uses and various thicknesses. Also, chemical compositions are prescribed. Specifically, among five major elements, the upper limit value of an allowable range of the carbon (C) content is prescribed for each of the classes and thicknesses, and the corresponding values of the other four elements are also prescribed. Among the classes prescribed in JIS G 3106, the present invention is concerned with classes widely used as steel shape materials in general, specifically, SM400A and SM400B (these will hereinafter be generally referred to as "SM400") and SM490A and SM490B (these will hereinafter be generically referred to as "SM490") as defined in the Table below.

TABLE

Chemical Composition

Unit: %

| Symbol of grade | C | Si | Mn | P | S |
|---|---|---|---|---|---|
| SM400A | 50 mm or under in thickness 0.23 max. Over 50 mm, up to and incl. 200 mm in thickness 0.25 max. | — | 2.5 × C. min. ($^1$) | 0.035 max. | 0.035 max. |
| SM400B | 50 mm or under in thickness 0.20 max. Over 50 mm, up to and incl. 200 mm in thickness 0.22 max. | 0.35 max. | 0.60 to 1.40 | 0.035 max. | 0.035 max. |
| SM490A | 50 mm or under in thickness 0.20 max. Over 50 mm, up to and incl. 200 mm in thickness 0.22 max. | 0.55 max. | 0.60 max. | 0.035 max. | 0.035 max. |
| SM490B | 50 mm or under in thickness 0.18 max. Over 50 mm, up to and incl. 200 mm in thickness 0.20 max. | 0.55 max. | 1.60 max. | 0.035 max. | 0.035 max. |

Note
($^1$): The value of carbon herein is the actual cast analysis value;
Remark: Alloying elements other than those given in the Table may be added as necessary.

JIS G 3160 also prescribed the upper limit value of an allowable range of the carbon equivalent in a sheet steel subjected to the thermo-mechanical control as described in "Attachment 1" of the standards. In the case of a sheet steel belonging to the class SM490 and having a thickness below 50 mm, the upper limit value is 0.38%. According to the present invention, a steel material of this kind used for the production of shapes having a carbon equivalent within a range the upper limit of which is lower than the above prescribed value, and which is also limited by a lower limit value so as to narrow the acceptable range. Thus, steel compositions used in the production of shapes according to the present invention have a minimized number of varieties of steel compositions.

The tensile strength (MPa) of a steel material is, according to Pickering, expressed by the following empirical formula (1), and the strength level of a rolled steel is substantially determined by the contents of components in the steel composition set by the alloy design, the pearlite proportion, and the ferrite grain size.

$$\text{Tensile Strength (MPa)} = 15.4\,[19.1 + 1.8(\% \text{Mn}) + 5.4(\% \text{Si}) + 0.25 + 0.5d^{-1/2}] \quad (1)$$

wherein symbol d represents the ferrite grain size (mm).

Accordingly, in order to assure a uniform strength, and thus, to allow a reduced alloy content, it is essential to control the rolling in such a manner that controlled rolling and accelerated cooling achieve an increased pearlite proportion and a finer ferrite grain size. The ferrite ($\alpha$) grain size is determined by the number of $\alpha$ nucleation sites during the $\gamma/\alpha$ transformation and the speed of grain growth, and is influenced by ① the grain size of austenite ($\gamma$) before the $\gamma/\alpha$ transformation, and ② the working temperature and the amount of strain during heat treatment which is, typically, accelerated-cooling-type controlled rolling (TMCP), as well as the cooling rate within the transformation region. On the other hand, the pearlite proportion is mainly determined by the pearlite transformation temperature, which transformation temperature changes depending on the cooling rate.

The present invention is based on the above-described principles. In producing flanged shapes (typically, H-beams) by rolling, the present invention is adapted to prevent differences in quality between various portions of the beams (i.e., the web, flange and fillet portions thereof) which are caused by differences in the finishing rolling temperature, the draft ratio and the cooling rate due to their peculiar shapes or dimensions. Specifically, the present invention achieves a uniform quality between various portions of beams by effecting the cooling of only the flange portion during and after the rolling so as to approximate, as much as possible, the heat history (history of temperature through the cross-section) of the flange to the heat history of the web portion which has a smaller thickness than the flange portion and which is likely to have a higher cooling rate during the low-temperature finishing process. This arrangement makes it possible to reduce differences in the pearlite proportion and the ferrite grain size between these portions, and hence, to make the structure of various portions uniform.

The present invention is adapted to minimize and save the number of the steel compositions of blooms needed to produce shapes or beams of various dimensions. Specifically, the steel composition required by a shape or beam having a flange thickness of 12 mm (the smallest thickness within the range specified in the present invention) is approximated as close as possible to the steel compositions required for various beams having a flange thickness up to the largest thickness in the specified range. For this purpose the cooling of the flange portion during and after the rolling is suitably controlled in accordance with thickness differences. In this way the number of varieties of steel composition needed for production of shapes of various sizes can be minimized.

The following are the reasons for various limitations specified in the present invention.

According to the present invention the steel grade SM400 should have a carbon equivalent within the range from 0.21 to 0.25%, and the steel grade SM490 should have a carbon equivalent within the range from 0.29 to 0.37%. These limitations are mainly for the purpose of minimizing as much as possible the required number of varieties of steel composition, and also for the purpose of improving toughness and weldability of the product. The carbon equivalent can be calculated by the following formula:

$$\text{Carbon Equivalent (\%)} = C + Mn/6 + Si/24 + Ni/40 + Cr/5 + Mo/4 + V/14$$

The H-beam product is specified to have a flange thickness within the range from 12 to 40 mm for the reason that the beams having a flange thickness within this range are produced in large quantities for general use in construction, and the minimization of the required number of varieties of chemical composition for the production of such beams is considered to be very advantageous.

The controlled rolling and the controlled cooling, constituting a characteristic feature of the present invention, are performed under certain conditions specified for the following reasons.

When starting the rolling for the production of H-beam steel, the bloom should be re-heated to a temperature within the range from 1100° to 1300° C. In order to form the beam by hot-rolling, heating to a temperature of not lower than 1100° C. is necessary so as to facilitate plastic deformation. The upper limit of the temperature range is set at 1300° C. from the viewpoints of economy and capacity of a heating furnace.

The heated steel material is subjected to rolling comprising a rough rolling step, an intermediate rolling step (usually, universal rolling), and a finishing rolling step. The rolling according to the present invention is characterized in that, in an intermediate rolling mill, the flange portion is water-cooled to a surface-layer temperature of not higher than 750° C. between rolling passes, and the work is subjected to hot reverse rolling during recuperation of the surface of the steel material at least one time during the intermediate rolling step, and the rolling is performed in such a manner that the flange portion has an average rolling temperature of not higher than 950° C. and that a total draft ratio of not less than 20% is achieved. The water-cooling is performed to allow a flange portion having a relatively great thickness to have a temperature approximate to that of the web portion, and to approximate the finishing rolling temperature of a relatively thick beam to that of a relatively thin beam. The thus arranged intermediate rolling step makes it possible to impart a temperature gradient from the surface layer of the flange portion toward the center of the thickness thereof, which in turn makes it possible for the working effect to prevail into the inner part of the work piece even under a low-draft rolling condition, thus refining the grain size even in the center of the thickness.

The reason why the rolling is performed in such a manner that the flange portion has an average rolling temperature of not higher than 950° C., and the total draft ratio is not less than 20% is that an average rolling temperature exceeding 950° C. cannot achieve the effect of refining the grains by the controlled rolling, and that a total draft ratio of less than 20% does not provide sufficient effect of refinement of grains even if the average rolling temperature is 950° C. or lower.

The water cooling and the rolling during recuperation are performed in proportion to the thickness of the material being rolled, such as the thickness of the flange, and they are repeatedly performed a plurality of times when the flange is relatively thick. In the intermediate rolling step, the surface layer portion of the flange is cooled to a surface-layer temperature of not higher than 750° C. for the following reason: the rolling is followed by accelerated cooling, and if this accelerated cooling is effected from the normal γ temperature range, the surface layer portion may be quenched to form a hardened phase, which may impair workability. In contrast, if, in the cooling step, the surface layer portion is cooled to a temperature of 750° C. or lower, the surface layer portion of the flange is once cooled to a temperature below the γ/α transformation temperature, and the surface-layer temperature increases by recuperation before the subsequent rolling passes. Thus, working is performed within a low temperature range of a γ/α phase co-existing temperature range, thereby considerably reducing the risk of quenching, so that the accelerated cooling will not cause quenched hardening of the surface layer.

After the rolling step, the flange portion is cooled at a cooling rate of from 0.5° to 10° C./S so that the accelerated cooling is able to restrain the growth of ferrite grains and increase the ratio of the pearlite and bainite proportions so that it is possible to achieve a desired strength with a low alloy content.

The present invention will now be described by examples.

(EXAMPLES)

Shape steel samples, i.e., samples according to the present invention and those according to conventional methods, were produced in the following manner: a bloom with a thickness of from 240 to 300 mm was prepared by continuous-casting molten steel obtained from a converter; and an H-beam was produced from the bloom by using an apparatus shown in FIG. 1. The apparatus included an intermediate universal rolling mill 4, and a finishing universal rolling mill 6. Water-cooling between rolling passes was effected by spray-cooling the outer surface of the flange portion of the work by water-coolers 5e disposed upstream and downstream of the intermediate universal rolling mill 4. Accelerated cooling after rolling included spray-cooling the outer surface of the flange portion by a water-cooler 5b disposed downstream of the finishing universal rolling mill 6.

Figure 2:
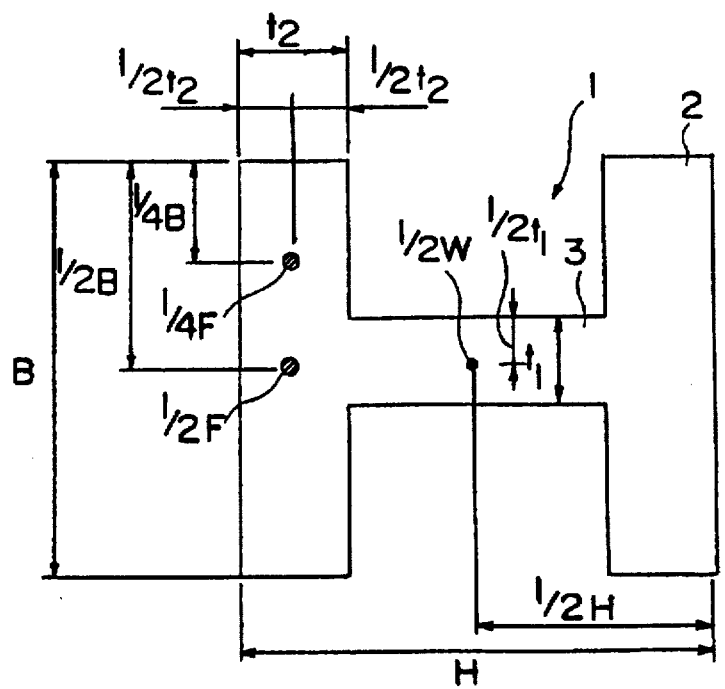
FIG. 2 is an explanatory view showing the cross-sectional contour of an H-bean and positions at which test samples for mechanical properties were taken.

FIG. 2 shows the cross-sectional configuration of each H-beam 1 having a flange 2 and a web 3. The mechanical properties of each H-beam 1 were measured by obtaining test samples from the following portions of the cross-sectional configuration: first and second portions (¼F and ½F, respectively) at the intersections between the line drawn at the center (½$t_2$) of the thickness $t_2$ of the flange 2 and the lines drawn at ¼ and ½ of the width B of the flange 2 (i.e., at ½B and ¼B, respectively); and a third portion (½W) at the intersection between the line drawn at the center (½$t_1$) of the thickness $t_1$ of the web 3 and the line drawn at ½ of the height H of the web 3 (i.e., at ½H). Mechanical properties at these portions were measured because the first portion ¼F of the flange 2 and the third portion ½W of the web 3 have average mechanical properties among various portions of the flange 2 and the web 3, respectively, while the second portion ½F of the flange 2 has the lowest mechanical properties among various portions of the beam 1. Thus, mechanical properties measured at these three portions were believed to represent the mechanical properties of the entire H-beam 1.

The beam samples had the steel compositions shown in Table 1, and the dimensions shown in Table 2. Table 2 also shows various rolling and accelerated-cooling conditions adopted in production according to the present invention and conventional methods as well as the values of mechanical properties obtained by conducting tests. In the production, each bloom was heated to a uniform temperature of 1280° C. before rolling for the following reason: since it is known that, in general, decreasing heating temperature improves mechanical properties, when the heating temperature is set to a relatively high value, the thus obtained product is believed to provide mechanical properties values substantially at the lowest of all the levels the product can provide. Thus, the mechanical properties values provided at such a heating temperature were believed to represent the mechanical properties of a product.

TABLE 1

(wt %)

| STEEL TYPE | C | Si | Mn | N | Al | P | S | Ceq (%) |
|---|---|---|---|---|---|---|---|---|
| PRESENT INVENTION SM400 | | | | | | | | |
| 1 | 0.14 | 0.14 | 0.39 | 0.005 | 0.021 | 0.015 | 0.009 | 0.21 |
| 2 | 0.15 | 0.18 | 0.55 | 0.004 | 0.018 | 0.016 | 0.008 | 0.25 |
| SM490 | | | | | | | | |
| 3 | 0.15 | 0.21 | 0.81 | 0.004 | 0.024 | 0.011 | 0.008 | 0.27 |
| 4 | 0.16 | 0.22 | 1.22 | 0.004 | 0.029 | 0.010 | 0.006 | 0.37 |
| CONVENTIONAL METHODS SM400 | | | | | | | | |
| 5 | 0.15 | 0.29 | 0.51 | 0.005 | 0.018 | 0.016 | 0.008 | 0.25 |
| 6 | 0.14 | 0.27 | 0.65 | 0.005 | 0.027 | 0.014 | 0.007 | 0.29 |
| 7 | 0.11 | 0.30 | 1.20 | 0.004 | 0.033 | 0.019 | 0.009 | 0.32 |

TABLE 1-continued (wt %)

| STEEL TYPE | C | Si | Mn | N | Al | P | S | Ceq (%) |
|---|---|---|---|---|---|---|---|---|
| 8 | 0.17 | 0.32 | 0.91 | 0.004 | 0.023 | 0.010 | 0.007 | 0.34 |
| SM490 | | | | | | | | |
| 9 | 0.15 | 0.41 | 1.10 | 0.005 | 0.024 | 0.012 | 0.008 | 0.35 |
| 10 | 0.17 | 0.35 | 1.14 | 0.004 | 0.031 | 0.015 | 0.007 | 0.37 |
| 12 | 0.17 | 0.25 | 1.38 | 0.004 | 0.032 | 0.014 | 0.006 | 0.41 |
| 12 | 0.18 | 0.38 | 1.45 | 0.004 | 0.030 | 0.013 | 0.008 | 0.44 |

TABLE 2

| STEEL GRADE | SIZE OF H-BEAM | NUMBER OF TIMES OF FLANGE WATER-COOLING TO BELOW 750° C. AND ROLLING PORTION | TOTAL DRAFT AT BELOW 950° C. (%) | COOLING SPEED FROM 800 TO 650° C. (°C./S) | MECHANICAL PROPERTIES TENSILE STRENGTH (N/mm²) YP | TS | CHARPY TEST VE-5 (J) (AVERAGE) | SURFACE HARDNESS OF FLANGE OUTER SURFACE (Hv) |
|---|---|---|---|---|---|---|---|---|
| PRESENT INVENTION | | | | | | | | |
| SM400 | | | | | | | | |
| 1 | H450 × 200 × 8/12 | 1/4 F | 1 | 30 | 5.3 | 351 | 453 | 239 | — |
| | | 1/2 F | | | 4.0 | 341 | 445 | 211 | 155 |
| | | 1/2 W | | | — | 337 | 438 | 215 | — |
| 1 | H400 × 300 × 10/16 | 1/4 F | 2 | 30 | 4.5 | 328 | 447 | 238 | — |
| | | 1/2 F | | | 3.4 | 292 | 439 | 203 | 143 |
| | | 1/2 W | | | — | 289 | 441 | 219 | — |
| 1 | H750 × 300 × 13/24 | 1/4 F | 3 | 25 | 4.8 | 286 | 452 | 237 | — |
| | | 1/2 F | | | 4.1 | 270 | 432 | 216 | 158 |
| | | 1/2 W | | | — | 281 | 447 | 221 | |
| 2 | H800 × 300 × 14/26 | 1/4 F | 4 | 25 | 2.0 | 283 | 433 | 242 | — |
| | | 1/2 F | | | 1.6 | 267 | 418 | 223 | 157 |
| | | 1/2 W | | | — | 282 | 433 | 240 | — |
| 2 | H900 × 300 × 19/37 | 1/4 F | 5 | 25 | 0.9 | 268 | 422 | 238 | — |
| | | 1/2 F | | | 0.7 | 265 | 410 | 206 | 148 |
| | | 1/2 W | | | — | 279 | 421 | 236 | — |
| 2 | H438 × 417 × 30/40 | 1/4 F | 5 | 23 | 0.7 | 269 | 419 | 234 | — |
| | | 1/2 F | | | 0.5 | 258 | 408 | 297 | 144 |
| | | 1/2 W | | | — | 260 | 417 | 221 | — |
| SM490 | | | | | | | | |
| 3 | H450 × 200 × 8/12 | 1/4 F | 1 | 30 | 9.5 | 382 | 521 | 235 | — |
| | | 1/2 F | | | 7.1 | 368 | 513 | 217 | 179 |
| | | 1/2 W | | | — | 371 | 524 | 213 | — |
| 3 | H400 × 300 × 10/16 | 1/4 F | 2 | 30 | 7.1 | 373 | 524 | 231 | — |
| | | 1/2 F | | | 5.5 | 354 | 519 | 214 | 165 |
| | | 1/2 W | | | — | 380 | 508 | 221 | |

TABLE 2-continued

| STEEL GRADE | SIZE OF H-BEAM | PORTION | NUMBER OF TIMES OF FLANGE WATER-COOLING TO BELOW 750° C. AND ROLLING | TOTAL DRAFT AT BELOW 950° C. (%) | COOLING SPEED FROM 800 TO 650° C. (°C./S) | TENSILE STRENGTH (N/mm$^2$) YP | TS | CHARPY TEST VE-5 (J) (AVERAGE) | SURFACE HARDNESS OF FLANGE OUTER SURFACE (Hv) |
|---|---|---|---|---|---|---|---|---|---|
| 3 | H700 × 300 × 13/24 | 1/4 F | 3 | 25 | 5.9 | 364 | 522 | 239 | — |
|   |   | 1/2 F |   |   | 5.1 | 332 | 507 | 197 | 157 |
|   |   | 1/2 W |   |   | — | 360 | 501 | 204 | — |
| 4 | H800 × 300 × 14/26 | 1/4 F | 2 | 25 | 4.8 | 391 | 541 | 235 | — |
|   |   | 1/2 F |   |   | 3.2 | 363 | 513 | 227 | 179 |
|   |   | 1/2 W |   |   | — | 376 | 528 | 221 | — |
| 4 | H900 × 300 × 19/37 | 1/4 F | 3 | 25 | 3.4 | 364 | 524 | 238 | — |
|   |   | 1/2 F |   |   | 2.8 | 351 | 515 | 191 | 185 |
|   |   | 1/2 W |   |   | — | 367 | 518 | 214 | — |
| 4 | H438 × 417 × 30/40 | 1/4 F | 4 | 23 | 2.8 | 357 | 519 | 239 | — |
|   |   | 1/2 F |   |   | 2.1 | 346 | 503 | 182 | 187 |
|   |   | 1/2 W |   |   | — | 352 | 508 | 228 | — |
| CONVENTIONAL METHODS | | | | | | | | | |
| SM400 | | | | | | | | | |
| 5 | H450 × 200 × 8/12 | 1/4 F | 0 | 25 | 1.0 | 288 | 441 | 228 | — |
|   |   | 1/2 F |   |   | 0.7 | 267 | 428 | 184 | 143 |
|   |   | 1/2 W |   |   | — | 285 | 439 | 174 | — |
| 5 | H400 × 300 × 10/16 | 1/4 F | 0 | 18 | 0.8 | 252 | 411 | 225 | — |
|   |   | 1/2 F |   |   | 0.6 | 237 | 390 | 169 | 139 |
|   |   | 1/2 W |   |   | — | 272 | 422 | 188 | — |
| 6 | H400 × 300 × 10/16 | 1/4 F | 0 | 18 | 0.8 | 271 | 427 | 217 | — |
|   |   | 1/2 F |   |   | 0.6 | 255 | 412 | 157 | 151 |
|   |   | 1/2 W |   |   | — | 286 | 433 | 181 | — |
| 7 | H800 × 300 × 14/26 | 1/4 F | 0 | 17 | 0.5 | 272 | 428 | 191 | — |
|   |   | 1/2 F |   |   | 0.4 | 264 | 409 | 180 | 158 |
|   |   | 1/2 W |   |   | — | 291 | 446 | 178 | — |
| 7 | H900 × 300 × 19/37 | 1/4 F | 0 | 15 | 0.3 | 257 | 412 | 146 | — |
|   |   | 1/2 F |   |   | 0.2 | 231 | 383 | 32 | 153 |
|   |   | 1/2 W |   |   | — | 271 | 424 | 165 | — |
| 8 | H900 × 300 × 19/37 | 1/4 F | 0 | 15 | 0.3 | 276 | 430 | 144 | — |
|   |   | 1/2 F |   |   | 0.2 | 252 | 411 | 87 | 164 |
|   |   | 1/2 W |   |   | — | 287 | 442 | 153 | — |
| SM490 | | | | | | | | | |
| 9 | H450 × 200 × 8/12 | 1/4 F | 0 | 25 | 1.0 | 381 | 512 | 214 | — |
|   |   | 1/2 F |   |   | 0.7 | 268 | 522 | 155 | 169 |
|   |   | 1/2 W |   |   | — | 410 | 533 | 168 | — |
| 9 | H400 × 300 × 10/16 | 1/4 F | 0 | 18 | 0.8 | 366 | 495 | 181 | — |
|   |   | 1/2 F |   |   | 0.6 | 349 | 470 | 78 | 163 |
|   |   | 1/2 W |   |   | — | 381 | 510 | 167 | — |
| 10 | H400 × 300 × 10/16 | 1/4 F | 0 | 18 | 0.8 | 378 | 523 | 204 | — |
|    |   | 1/2 F |   |   | 0.6 | 360 | 502 | 82 | 171 |
|    |   | 1/2 W |   |   | — | 403 | 542 | 146 | — |
| 11 | H800 × 300 × 14/26 | 1/4 F | 0 | 17 | 0.5 | 365 | 525 | 169 | — |
|    |   | 1/2 F |   |   | 0.4 | 348 | 513 | 67 | 165 |
|    |   | 1/2 W |   |   | — | 398 | 545 | 136 | — |
| 11 | H900 × 300 × 19/37 | 1/4 F | 0 | 15 | 0.3 | 341 | 509 | 77 | — |
|    |   | 1/2 F |   |   | 0.2 | 309 | 478 | 33 | 163 |
|    |   | 1/2 W |   |   | — | 379 | 523 | 136 | — |
| 12 | H900 × 300 × 19/37 | 1/4 F | 0 | 15 | 0.3 | 372 | 523 | 92 | — |
|    |   | 1/2 F |   |   | 0.2 | 347 | 509 | 51 | 178 |
|    |   | 1/2 W |   |   | — | 399 | 531 | 104 | — |

According to the present invention, the use of only two different steel grades of SM400 (steel types 1 and 2 shown in Tables 1 and 2) which have a carbon equivalent of from 0.21 to 0.25% enables the production of H-beams with various sizes having flange thicknesses ranging from 12 to 40 mm. Similarly, the use of only two different steel grades of SM490 (steel types 3 and 4 shown Tables 1 and 2) which have a carbon equivalent within the range from 0.29 to 0.37% enables the production of H-beams with various sizes having flange thicknesses within the above range. Each sufficiently affords the material strength prescribed in JIS G 3106 and the prescribed Charpy value at −5° C. of not less than 47 (J). In contrast, with the conventional methods, which lacks the controlled rolling and flange water-cooling as specified in the present invention, a variety of steel grades of SM400 (steel types 5 to 8 shown in Table 1 and Table 2 (cont.)) have to be used in correspondence with various flange thicknesses. Similarly, a variety of steel grades of SM490 (steel types 9 to 12 shown in the above Tables) have to be used in correspondence with the various flange thicknesses. For example, when the steel type 5 for use in production with a size H540×200×8/21 was used in a conventional method to produce a size H400×300×10/16, that is, with a greater flange thickness, it was not possible to meet prescribed values of yield point and tensile strength, as indicated by underlines in Table 2 (cont.). Further, the use of each of the steel types 7, 9 and 11 in a conventional method failed to satisfy the standards when the size of the product is increased, as indicated by underlines in the above Table.

Thus, with a production method meeting all the requisites according to the present invention, eight varieties of steel grade SM400 and ten varieties of steel grade SM490 which have been needed to produce an H-beam with sizes having a flange thickness of from 12 to 40 mm, can be minimized to two varieties of each grade, as shown in Table 3.

TABLE 3

| STEEL GRADE | CARBON-EQUIVALENT RANGE (%) | NUMBER OF STEEL TYPES |
| --- | --- | --- |
| PRESENT INVENTION | | |
| SM400 | 0.21–0.25 | 2 |
| SM490 | 0.27–0.37 | 2 |
| CONVENTIONAL METHODS | | |
| SM400 | 0.25–0.34 | 8 |
| SM490 | 0.35–0.44 | 12 |

Needless to say, shapes or sections which may be produced by the method according to the present invention are not limited to H-beams described in the foregoing examples, and the shapes or beams may alternatively be a flanged shape steel such as I-beams, angles, channels or unequal-sided unequal-thickness beams. Further, the present invention may be also applied to production of shapes or beams using a steel belonging to steel grades SS400 and SS490 prescribed in JIS G 3101 as "rolled steel materials for general structures" which are a lower grade than the steel materials prescribed in JIS G 3106 to which the present invention mainly pertains.

As described above, according to the present invention, it is possible to minimize the number of steel-compositions that has been needed to produce shapes or sections with various sizes; specifically, eight varieties of steel grade SM400 and ten varieties of steel grade SM490, which have been needed to produce H-beams of various sizes, can be minimized to two varieties of each grade. This makes it possible to greatly simplify rolling operations and bloom inventory management, as well as to greatly decrease bloom stock.

Since shapes produced by the method according to the present invention have a reduced carbon equivalent, it is possible to produce, at a low cost, H-beams or the like having improved weldability, workability, etc., which in turn improve the efficiency of construction works. Thus, the present invention provides great industrial advantages such as improved reliability of large buildings, secure safety, and improved level of economy.

What is claimed is:

1. A method for producing a steel beam having a flange portion with a flange thickness of 12 to 40 mm and a web portion with a smaller thickness than the flange portion, by a rolling process including a rough rolling step, an intermediate rolling step and a finishing rolling step, comprising:

(1) heating a steel bloom consisting essentially of the chemical composition as specified by SM400A) SM400B, SM490A or SM490B as defined below to a temperature ranging from 1100° to 1300° C. to form a heated steel bloom,

| | | | | | Unit: % |
| --- | --- | --- | --- | --- | --- |
| Symbol of grade | C | Si | Mn | P | S |
| SM400A | 50 mm or under in thickness 0.23 max. Over 50 mm, up to an incl. 200 mm in thickness 0.25 max. | — | 2.5 × C. min. ($^1$) | 0.035 max. | 0.035 max. |
| SM400B | 50 mm or under in thickness 0.20 max. Over 50 mm, up to an incl. 200 mm in thickness 0.22 max. | 0.35 max. | 0.60 to 1.40 | 0.035 max. | 0.035 max. |
| SM490A | 50 mm or under in thickness 0.20 max. Over 50 mm, up to an incl. 200 mm in thickness 0.22 max. | 0.55 max. | 1.60 max. | 0.035 max. | 0.035 max. |
| SM490B | 50 mm or under in thickness 0.18 max. Over 50 mm, up to an incl. 200 mm in thickness 0.20 max. | 0.55 max. | 1.60 max. | 0.035 max. | 0.035 max. |

(2) rough rolling the heated steel bloom into a rough-rolled steel beam forming a flange portion having a surface layer, (3) subjecting said rough-rolled steel beam of step (2) to a plurality of intermediate rolling passes and water-cooling only the flange portion of the rough rolled steel beam between rolling passes in the intermediate rolling step to cool the surface layer of the flange portion to a temperature not higher than 750° C., and rolling the flange portion during recuperation of the surface layer of the flange portion within a $\gamma/\alpha$ phase co-existing temperature range at least one time between the rolling passes with a total draft not less than 20% and at an average rolling temperature not higher than 950° C., and (4) finish rolling the steel beam of step (3) and cooling the flange portion at a cooling rate, measured at the outer surface of the flange portion, ranging from 0.5° to 10° C./sec depending on the thickness of the flange portion after the finishing rolling step.

2. A method according to claim 1, wherein said steel bloom is prepared from SM400A or SM400B steel and has a carbon equivalent ranging from 0.21 to 0.25%.

3. A method according to claim 1, wherein said steel bloom is prepared from SM490A or SM490B steel and has a carbon equivalent ranging from 0.29 to 0.37%.

* * * * *